US010836535B1

(12) United States Patent
Watts

(10) Patent No.: US 10,836,535 B1
(45) Date of Patent: Nov. 17, 2020

(54) APPLIED LOW EMISSIVITY COATINGS FOR REDUCED EMISSION OF THERMAL RADIATION IN DISPOSABLE CONTAINERS

(71) Applicant: Aaron Watts, Spokane, WA (US)

(72) Inventor: Aaron Watts, Spokane, WA (US)

(*) Notice: Subject to any disclaimer, the term of this patent is extended or adjusted under 35 U.S.C. 154(b) by 30 days.

(21) Appl. No.: 15/786,216

(22) Filed: Oct. 17, 2017

Related U.S. Application Data

(60) Provisional application No. 62/426,496, filed on Nov. 26, 2016, provisional application No. 62/409,038, filed on Oct. 17, 2016.

(51) Int. Cl.
  *B65D 25/14* (2006.01)
  *B65D 65/46* (2006.01)
  *C09D 7/48* (2018.01)
  *C09D 1/00* (2006.01)
  *B65D 81/38* (2006.01)
  *C23C 16/12* (2006.01)

(52) U.S. Cl.
  CPC .......... *B65D 25/14* (2013.01); *B65D 65/466* (2013.01); *B65D 81/38* (2013.01); *C09D 1/00* (2013.01); *C09D 7/48* (2018.01); *C23C 16/12* (2013.01)

(58) Field of Classification Search
  CPC .......... B65D 25/34–36; B65D 65/466; B65D 81/3874; B65D 81/3841; B65D 81/3869; C23C 14/20
  See application file for complete search history.

(56) References Cited

U.S. PATENT DOCUMENTS

| 4,803,094 A | * | 2/1989 | Myers | C23C 14/20 |
| | | | | 118/726 |
| 5,370,883 A | * | 12/1994 | Saunier | B65D 25/36 |
| | | | | 219/729 |
| 2003/0216492 A1 | * | 11/2003 | Bowden | B65D 65/466 |
| | | | | 524/47 |
| 2008/0121681 A1 | * | 5/2008 | Wiedmeyer | B32B 1/02 |
| | | | | 229/403 |
| 2011/0247957 A1 | * | 10/2011 | Lorente Echevarria | |
| | | | | B65D 1/42 |
| | | | | 206/524.6 |
| 2012/0205426 A1 | * | 8/2012 | Neary | D21H 19/06 |
| | | | | 229/5.83 |

FOREIGN PATENT DOCUMENTS

WO  WO 2016/054019 A1  4/2016

* cited by examiner

*Primary Examiner* — Alex A Rolland

(57) ABSTRACT

Various embodiments of the presented technology include the application of a low emissivity coating, such as a vacuum chemical vapor deposited aluminum coating, to: a) a paper substrate; b) a recyclable polymer substrate; c) a biodegradable polymer substrate; d) any biodegradable substrate; e) a polymer substrate; that is then laminated to a container, such as a disposable paper coffee or tea cup. In some embodiments, the low emissivity coated laminate may be applied to the container materials prior to the materials being formed, or they may be laminated after the disposable container has been formed. The final form is a container, such as a disposable paper coffee or tea cup that has a low emissivity coating applied to all surfaces facing away from the containers contents.

10 Claims, 4 Drawing Sheets

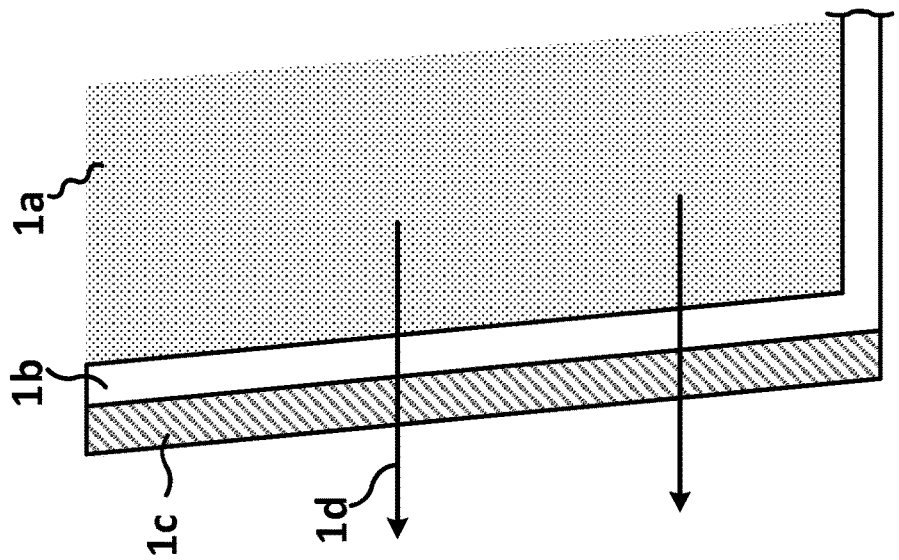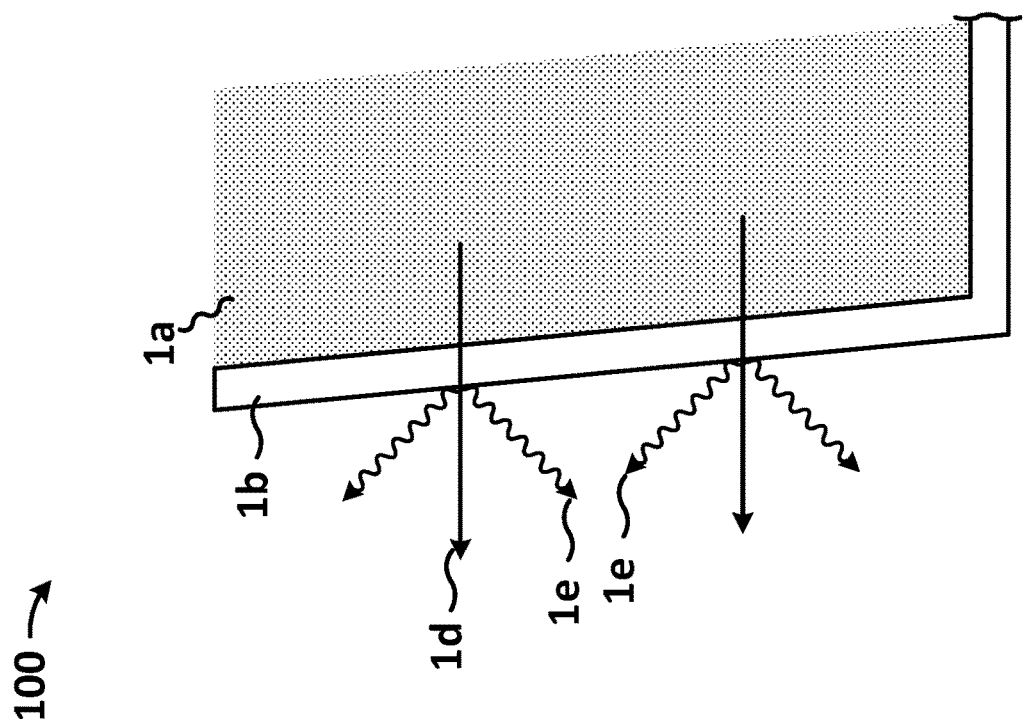
FIG. 1

APPLIED LOW EMISSIVITY COATINGS FOR REDUCED EMISSION OF THERMAL RADIATION IN DISPOSABLE CONTAINERS

CROSS-REFERENCE TO RELATED APPLICATION

The present application claims priority to and benefit from U.S. Provisional Patent Application No. 62/409,038 entitled "Disposable, Compostable and Biodegradable Container with Thermal Radiation Barrier" filed on Oct. 17, 2016, and U.S. Provisional Patent Application No. 62/426,496 entitled "Applied Low Emissivity Coatings for Reduced Emission of Thermal Radiation in Disposable Containers" filed on Nov. 26, 2016, the entire content of each of which is herein expressly incorporated by reference for all purposes.

TECHNICAL FIELD

Various embodiments of the present technology generally relate to low emissivity coatings applied to disposable containers. More specifically, some embodiments relate to low emissivity coatings applied to disposable containers for the reduction and/or prevention of the emission of thermal radiation.

BACKGROUND

Disposable paper containers are used worldwide in the billions of units per year. Current production of disposable cups reaches nearly 500 billion units per/year as of 2016. Disposable cups can be manufactured from paper or numerous types of polymers, such as PET and Styrofoam.

The heavy usage of these cups present several environmental problems. First, although trees are theoretically a renewable source of cellulose paper, in reality their long growth cycles do not support frequent enough harvesting to meet increasing demand; this results in deforestation. Second, the polymer coating used to protect the paper in 'hot cups' and the solid polymer body of 'cold cups' are highly resistant to decomposition by natural means. Finally, the tight bond between the cellulose fibers of the paper and the polymer coatings of 'hot cups' create significant barriers to traditional recycling processes. Both 'hot cups' and 'cold cups' must have polymers separated from paper fibers before recycling can take place. This process is extremely energy intensive, and the capital costs to implement it are high.

One attempt to address these issues has been the creation of 'bio-polymers', or polymers made from plant resources as opposed to hydrocarbon resources, such as Polylactic Acid (PLA). These polymers, in some cases, can be composted. Nonetheless, the polymer's barrier properties (required to protect the cellulose fibers of standard paperboard from liquids) prevent most polymers from being properly composted and keep the cup from being efficiently recycled. These polymers are, however, an excellent beginning step towards reducing the carbon footprint of polymer materials in general.

Biodegradability and/or compostability of disposable containers is at the forefront of importance for adaptation of the industry. Government municipalities are beginning to ban goods that cannot be efficiently recycled, degraded or composted. Examples of this can be seen throughout New York City, the entire state of California, as well as in some other countries such as France.

Although environmental issues are of primary concern with current disposable service-ware, there also exist significant performance issues, primarily rapid thermal changes. Several organizations have attempted to overcome this problem, including Starbucks, the largest retailer of consumer coffee and tea products.

The rapid thermal exchange between disposable cups and their environment creates several issues. First, large amounts of heat exiting the cup require the cup to have additional layers of material in the form of a sleeve or an extra cup (one placed inside the other) to protect the consumer's hands from potential burns. This 'double cupping' creates yet another environmental issue; it doubles the waste per consumer of a product that cannot be composted and traditionally is not recycled. This same thermal loss can be seen in reverse when cold beverages are used. The beverage rapidly gains heat from its surroundings and quickly warms and/or melts.

Second, rapid thermal exchange limits the time in which the contained beverage is considered to be at a drinkable temperature (135° F.-150° F. for hot drinks and 35° F.-50° F. for cold drinks). A standard disposable cup will cross this temperature window within the space of 10 minutes given an ambient temperature of 70° F. and common handling behaviors.

Finally, rapid thermal exchange creates a barrier to several commercial business expansion opportunities sought by major coffee retailers. Many retailers have begun using smart phone 'apps' that allow customers to order their drinks ahead of their arrival. This reduces time waiting in line, thereby increasing average number of customers served per unit of time. It also increases the speed of the transaction, as the consumer's payment information is generally already stored within the 'app.' However, given the rapid thermal exchange of the disposable cup used, the time that a customer may order ahead is significantly decreased, rendering the program much less effective.

SUMMARY

The majority of solutions to date for rapid thermal exchange in disposable containers have focused on slowing conductive and convective thermal losses via additional insulation. However, conductive/convective losses account for only a small portion of total thermal loss. One of the largest contributors to heat loss is thermal radiation exchange. Radiation exchange has been ignored because the usual means of blocking thermal radiation has been to use layers of aluminum or another highly reflective metal foil, and adding metal foils to disposable cups increases waste, while decreasing the overall recyclability, biodegradability, and/or compostability of the product.

Recently, however, manufacturing industries have begun to deposit thin films of aluminum onto numerous types of substrates in order to achieve particular qualities. One of these qualities, termed Multi-Layer-Insulation (MLI), often used in spacecraft and space gear, is the reflection and/or low emission of thermal radiation via a thin film of aluminum deposited onto a polymer film. The aerospace industry has easily achieved emissivity values of ≤0.05 with a deposited layer of aluminum measuring only 300 Å (or 0.03 μm) in thickness. For reference comparison, the emissivity of plain paper is roughly 0.90. Also of note, the polymer coating used on the inside of traditional 'hot cups' varies between 12.5 μm and 25 μm in thickness, or nearly 3 orders of magnitude thicker than the aluminum deposition thickness required to achieve extremely low emissivity values. These same thin films of aluminum are also heavily utilized in the packaging industries to increase the barrier properties of polymers, while shielding the contents of their packages from UV radiation. They are also used in electronics packaging as electro-static shields to protect components from voltage damage during storage and transportation.

Other types of thin film coatings may also be used should aluminum be inappropriate for the application. In addition to aluminum coatings, there exist many different combinations of metals, metal oxides, and polymers that may be classified as 'low emissivity coatings. The purpose of these coatings is to change the way electromagnetic waves behave. Many of these coatings are based on the theory of wave interference; however, continuing research is going into the development of phonon semi-conductor materials. These semi-conductor materials would allow for the direct control of all thermal transport—not just radiation, but also conductive and convective transport. As these materials develop, they will be a natural extension of the current application. Low emissivity coatings are generally applied with a thickness in the range of nanometers to several hundreds of nanometers, depending on the wavelength of the electromagnetic radiation with which they are intended to interact.

These ultra thin films can be deposited onto their target substrates by a variety of methods including, but not limited to, Chemical Vapor Deposition (CVD), Physical Vapor Deposition (PVD), Plasma Enhanced CVD (PECVD), Atomic Layer Deposition (ALD), Chemical Solution Deposition (CSD), Chemical Bath Deposition (CBD), Metalorganic Vapor Phase Epitaxy (MOCVD), Vacuum Deposition, Molecular Beam Epitaxy (MBE), Chemical Beam Epitaxy (CBE), Sputtering, Pulsed Laser Deposition, Ion Beam Deposition, Cathodic Arc Deposition (arc-PVD), Electrohydrodynamic Deposition (Electrospray Deposition), Frank-van-der-Merwe Growth Mode, Stranksi-Krastanov Growth Mode, Volmer-Weber Growth Mode, and Thin Film Printing.

While the majority of thin film aluminum deposition use in packaging has been with polymer substrates, paper substrates have also shown the ability to accept thin film aluminum deposition; however they have found little use outside of decorative avenues in the packaging world. There is, however, a use with far greater practical and commercial potential. The addition of a thin film aluminum layer to the outer surface or surfaces of a single walled, or multi-walled, disposable container allows for a near complete thermal radiation blockade, thereby maintaining the container's temperature for a significantly longer period of time, resolving all of the thermal exchange issues described above.

Further, that the proper implementation of an additional layer, or layers, of aluminum does not affect the recyclability and/or compostability of the container. This is due to several factors. First, the thin film of aluminum does not provide a moisture barrier and therefore does not block moisture from degrading the base product. Second, due to the extreme 'thinness,' the amount of aluminum in the product is of little significance when considering contamination in recyclable products or pollution in compostable products. Third, aluminum itself is not a toxic (or heavy) metal.

BRIEF DESCRIPTION OF THE DRAWINGS

Embodiments of the present technology will be described and explained through the use of the accompanying drawings in which:

FIG. 1 is a cross section of two single walled disposable containers.

Figure 2:
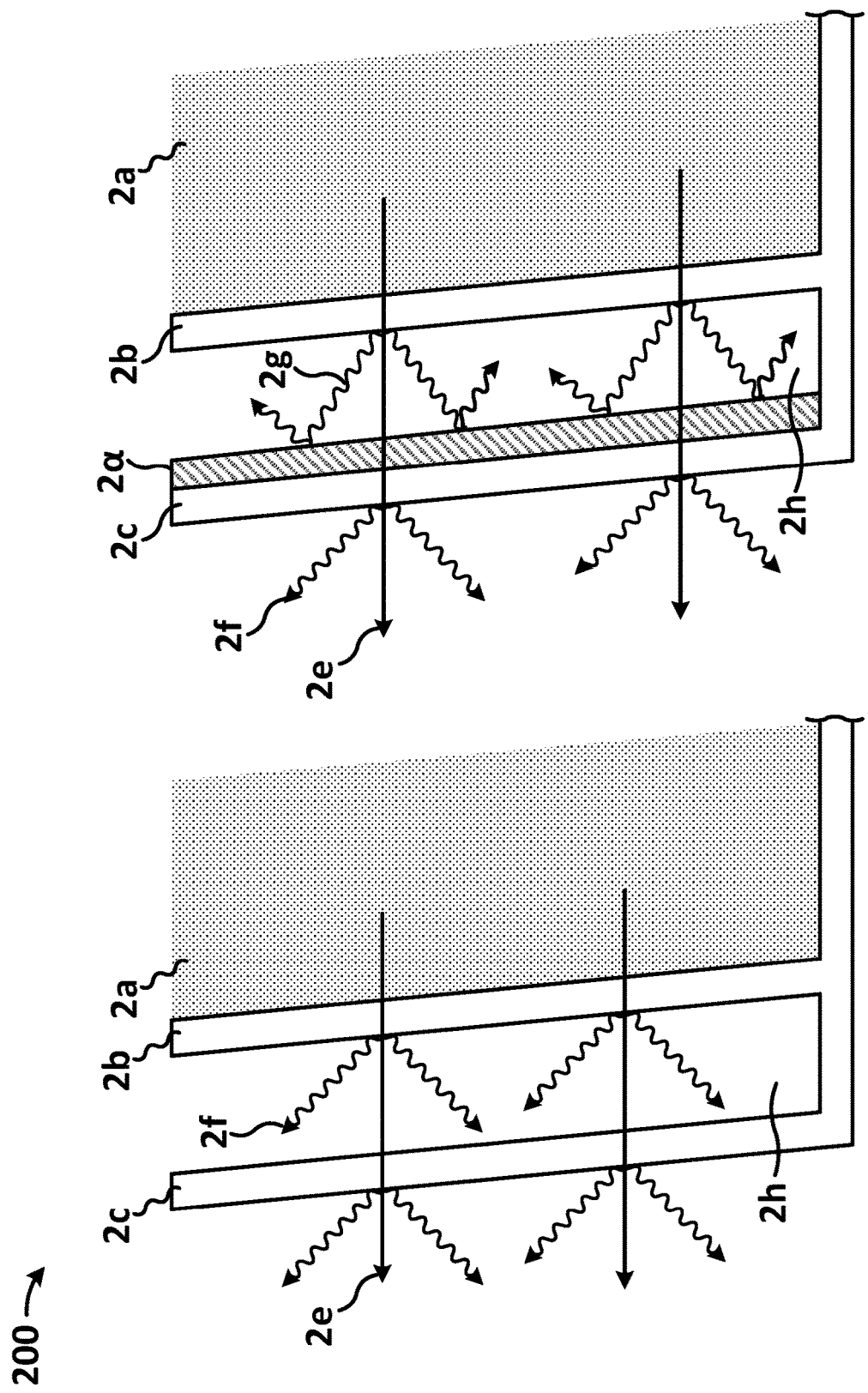
FIG. 2 is a cross section of two double walled disposable containers.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Fully understanding the flow of thermal energy within a disposable container is beneficial before implementing components to prevent the loss of thermal energy. Thermal losses are mediated by three mechanisms: conduction of thermal energy throughout the body of the container to the surrounding environment (including a person's hand), convection of the air around the container, and radiation of electromagnetic thermal energy away from the container.

Conduction and convection are closely related processes. Through conduction, heat passes from the outermost layer of the container into the closely surrounding air. The higher energy (hotter) air molecules are then forced away from the container and replaced by lower energy (colder) air molecules through convection. As convection continues to replace the higher energy (hotter) air particles—heated by conduction from the container's surface—with lower energy (colder) molecules, the rate of energy transfer is increased due to the larger temperature difference introduced between the container and surrounding air. This relationship between conduction and convection helps explain why simply having 'uncontained air' around a container is not an effective insulation method.

Therefore, the traditional means of adding insulation to a disposable container has been to create a 'double walled' container that creates a small 'contained air gap' between the two walls. This method is effective because it prevents the convective flow of thermal energy that would traditionally surround the immediate outer layer of a container. This prevents the thermal energy from convecting away from the container, as it did in the previous example. Hence, for practical purposes, heat loss in this 'contained air gap' is through conduction only rather than through conduction and convection. And since air has a thermal conductivity of 0.024 W/mK while paper has a thermal conductivity of 0.05 W/mK, only half as much area is needed to achieve a specific reduction in conductive losses between two mediums (generally the contents of the container and the hand of the consumer) as would be needed if this space were filled with solid paper.

Nonetheless, such insulation methods still leave a major source of thermal energy loss unaddressed-electromagnetic radiation. Traditionally, this method of thermal loss is ignored in disposable containers for many of the reasons listed previously (cost, environmental concern, etc.). However, radiative losses are a significant portion of the total thermal losses of a disposable container. Previous works have attempted to address this form of thermal loss by describing methods by which one may 'reflect' thermal radiation back at the container. Generally, this is accomplished by implementing a highly reflective surface on the inside of the outer wall of an air gap, facing back at the container, such as in represented by item 2d in FIG. 2. While this method does indeed reflect some thermal radiation, it is in fact a deeply flawed, and ineffective method of preventing radiative losses in a container, and it stems from a misunderstanding of the behavior of thermal radiation.

While reflective surfaces such as those of polished metals, foils, and metallized films, do in fact reflect thermal radiation, they are not all created equal. What human eyesight 'sees' as reflective, does not necessarily suggest that the surface will reflect, or interfere with, thermal radiation. The human eye sees electromagnetic energy between the wavelengths of 400 nm and 700 nm. However, in the case of the thermal radiation generally encountered from disposable containers, the wavelength is generally between 3.5 µm and 20 µm. Because of this, visual inspection of a surface is a very poor indicator of how an object may "reflect" thermal energy.

Most surfaces that have been engineered to interfere with thermal radiation are measured by their emissivity. Emissivity is calculated as a ratio of thermal absorbance to thermal emittance. This ratio is on a scale between 0 and 1. A perfect black body radiator would have an emissivity of 1. This would mean that it absorbs 100% of exposed thermal energy and reflects 0%, while emitting 100% of that thermal energy as well. A polished aluminum foil, however, may have an emissivity as low as 0.03, which would mean the foil absorbs just 3% of the exposed thermal radiation and reflects 97% of the thermal radiation away, while emitting just 3% of its thermal energy as radiation.

Another way to visualize this would be to heat up two different electrically resistive heating elements. Coat one of the heating elements in carbon black (emissivity of 0.97) and the other heating element in a polished aluminum foil (emissivity of 0.03). As both heating elements are equally powered, the carbon black element will feels as though it is putting off an enormous amount of heat to the surrounding environment, similar to how it feels when standing next to a campfire, while the aluminum heating-element is not. This is because the carbon black element is radiating 97% of its energy while the aluminum heating-element is only radiating 3%. However, as energy is failing to escape from the aluminum heating-element, the surface temperature of the aluminum heating-element will be significantly higher. (Please note that for the purpose of basic understanding, these examples are ignoring other types of losses such as conductive and convective losses.)

Understanding the behavior of thermal radiation as emissivity can reduce the design flaws of previous attempts to mitigate thermal radiation in disposable containers may be corrected. As previously mentioned, most solutions to date have been an attempt to 'reflect' thermal radiation back at the disposable container from across a small air pocket. This is a flawed theory for several reasons. The first of which can be explained by looking at heat conduction.

With perfect implementation this reflective surface may reflect 97% of the thermal radiation it encounters, which radiates from the first layer of the container, across the air gap, to the reflective surface (as seen in FIG. 2). However, thermal transfer is still occurring through conduction between the first layer of the container, to the air within the air gap, and then to the reflective surface. As this thermal energy is being transferred through conduction and NOT radiation, the reflective surface will absorb the thermal energy through conduction. To note for the examples ahead, paper, as used in the common disposable container, has an emissivity of 0.90 and is therefore, on its own, a potent radiator of thermal energy.

In this case, radiative energy that is reflected by the surface has simply been re-directed into an 'exchange loop' whereby it increases (heats up) the energy of the containers inside wall. This, in turn, increases the energy difference between the container's first wall and air gap, thus increasing the rate of conduction between the container's inside wall through the air gap and into the outside wall which contains the reflective surface facing towards the container. Hence, nearly the same amount of energy reaches the outermost layer of the container; it simply arrives by means of conductive transfer rather than radiative exchange.

And note that the outside wall of the container has the reflective surface facing inward. This means that the outside surface of that outer wall—that faces the environment—is simply paper or other disposable material. Paper has an emissivity of 0.90, and is a potent radiator of thermal energy. The outermost wall of the container (as represented by item 2c in FIG. 2) will now radiate with the same emissivity value as the first layer of the container, doing little to prevent the containers loss of thermal energy via thermal radiation. Therefore, virtually all of the energy that has arrived at the outer wall through this "energy loop" is now lost to the outside environment through conduction, convection, and radiation.

One can see, therefore, that although it may seem intuitive, the belief that 'reflecting' heat will prevent thermal transfer is a profound mistake. Such reflection merely re-directs the path through conductive transfer to once again be radiated away from the outer walls of the container.

The solution to this problem is to approach the issue from a different perspective. With the application of a low emissivity coating, in the case of disposable containers, we are not attempting to create a "barrier" by the reflection of radiative energy; we are instead attempting to prevent the material's ability to radiate thermal energy in the first place. This is a profoundly different way to approach the issue; it is in fact exactly the opposite of how the issue has been approached in the past.

Consider the previous example of the two heating elements. The carbon black element, with an emissivity of 0.97, was an incredibly strong radiator; however the aluminum element, with an emissivity of 0.03 was a very poor radiator. In this same manner one can understand that the aluminum element, with its very low emissivity, is radiating very little energy though it has been given the same energy. Applying this lesson to our disposable container, the proper conclusion is that any surface facing away from the container must have a low emissivity, like that of the aluminum heating-element. This is true because even though thermal energy is introduced to the material used as an optical coating, the coating is a very poor radiator, and therefore prevents the material from losing most of its energy via thermal radiation. By applying this method correctly, one can effectively prevent thermal radiation, as opposed to attempting to reflect that radiation.

Therefore, if one applies a low emissivity coating (emissivity of 0.03) to the outer surface of our disposable container's outer wall, the surface will now only radiate 3% of its energy. This will have reduced by 97% one of the major sources of thermal loss without the added complications of the addition of a contained air gap, or second layer with reflective barrier! Nonetheless, since the rules of thermal loss through conduction and convection still apply, one can see how adding layers of air or a contained air pocket to slow the conductive transfer of thermal energy from the container to the surrounding environment could still be helpful. To properly implement the reduction of radiative losses in this process as well, all surfaces facing away from the disposable containers contents, in contact with any form of matter that is translucent to thermal wavelengths or electromagnetic energy, should be of a low emissivity. In other words, the surfaces coated with low emissivity material should not be facing inward with the goal of 'reflecting' heat back toward the inside of the container but facing outward with the goal of 'preventing' radiation. This would provide the greatest reduction in thermal radiative loss.

However, one can see that this method may not always be conducive to manufacturing, nor the design of every disposable container. In these cases, the greater surface area exposed to materials that are translucent to thermal radiation wavelengths of electromagnetic energy (and facing away from the disposable containers contents) that can be coated with low emissivity coatings, the greater the reduction of losses via thermal radiation. This is in direct contrast to the idea that reflection of thermal radiation is the solution to prevention of loss via thermal radiation.

While the intention of these low emissivity coated surfaces facing away from the containers contents is to prevent the surfaces from emitting thermal radiation, another interesting and useful insulation effect is achieved. If the contents of the container happen to be cold, such as an iced drink, the low emissivity coated surfaces facing the surrounding environment also prevent the absorption of thermal radiation from surrounding objects, which are likely at room temperature. This slows the equalization of the containers contents with the surrounding environment.

The proper design and combination of these materials allows for the effective elevation of performance in the disposable container industry, with the potential to solve multiple problems within a single product. The benefits of this combination are the following: Full Compostability, Full Biodegradability, Full Recyclability, Improved Consumer Experience (maintenance of hot & cold products), Improved Commercial Opportunities (Order Ahead Programs, Increasing Customers Served Per Unit Time), Decreased Carbon Footprint (Thermal Emissions Decreased, Lower Usage Reheating and Cooling Equipment thereby saving power, Less Waste Material), along with numerous other potential benefits.

As thermal properties of the container are maintained for longer periods of time, other product opportunities become apparent. The longer period of time a consumer spends using a product, the greater the opportunity for consumer engagement.

There are many techniques for applying low emissivity coatings or low emissivity coated materials to finished products as well as pre-formed products. In some cases, simply laminating the pre-formed paper product with another low emissivity coated product prior to introduction to the forming machinery is enough. In other cases, direct application of the low emissivity coating to the 3D geometry may be required. In yet other cases, the base material may be directly coated prior to being cut and/or formed. In yet other cases, a low emissivity coated material may be introduced as a 'label' to an existing material.

The increased performance of the container allows for the future implementation of different technologies. One of the most interesting opportunities is the incorporation of disposable electronics, such as heating devices. PCT/US2015/052908, which is hereby incorporated by reference for all purposes, provides some examples.

Other technologies to be incorporated include, but are not limited too, flexible electronics devices, printed electronics devices, inexpensive electronic devices, organic electronic devices, biodegradable electronic devices, electronic devices made from recyclable and/or biodegradable and/or compostable materials.

In the context, these devices can be tasked to perform nearly any function sought when properly designed. Some of the most common embodiments include, but are not limited to, temperature monitoring circuitry, heating or cooling circuitry, display and lighting circuitry, thermoelectric circuitry, battery powering circuitry, wireless heating circuitry (e.g., PCT/US2015/052908), wired powering circuitry, transducer circuitry, touch sensitive interaction circuitry, electrophoretic circuitry, e-paper circuitry, capacitive touch circuitry, communication circuitry, acoustic circuitry, photonic circuitry, a multitude of sensor circuits such as, but not limited to, voltage sensing, light sensing, pressure sensing, sound sensing, temperature sensing, magnetic sensing, electromagnetic sensing, chemical sensing circuitry, and many more.

The following description sets forth, for the purposes of explanation, numerous specific details in order to provide a thorough understanding of embodiments of the present technology. It will be apparent, however, to one skilled in the art, that all of these specific details are not necessary to implement embodiments of the present technology. For convenience, the descriptions here of embodiments of the present technology are with reference to the reduction or prevention of thermal radiation emission from disposable containers via low emissivity coated surfaces.

EXAMPLES

Various embodiments of the presented technology include the application of a low emissivity coating, such as a vacuum chemical vapor deposited aluminum coating, to: a) a paper substrate; b) a recyclable polymer substrate; c) a biodegradable polymer substrate; d) any biodegradable substrate; e) a polymer substrate; that is then laminated to a container, such as a disposable paper coffee or tea cup. In some embodiments, the low emissivity coated laminate may be applied to the container materials prior to the materials being formed, or they may be laminated after the disposable container has been formed. Numerous methods of lamination exist, including but not limited to, wet lamination, dry lamination, ultrasonic lamination, thermal lamination, and many others. In some embodiments, low emissivity coated laminates may be added to the disposable containers materials by a simple 'labeling' machine. The final form is a container, such as a disposable paper coffee or tea cup that has a low emissivity coating applied to all surfaces facing away from the containers contents.

In other embodiments, a low emissivity coating is applied directly to the finished disposable container.

In yet other embodiments, a low emissivity coating is applied to the parts of a container prior to these parts being assembled.

In yet other embodiments, the container is assembled from substrate materials that already contain a low emissivity coating, such as a roll or ream of film or paper.

In some embodiments the disposable container may be constructed from paper, polymer, or biopolymer. Polymer is being used in its broad sense, as to include all organic and inorganic, natural and synthetic polymers. These include fibers from nearly all plants, including trees, hemp, kenaf, sugarcane, wheat, corn, and many others.

In some embodiments that disposable container is a coffee or tea cup. In yet other embodiments, the disposable container is a food or solid goods container. In other embodiments the disposable container is a construction for non-perishable goods. In yet other embodiments, the constructed container may be for non-food items. In yet other embodiments the container may be meant to withstand various environments and/or contain various barrier properties, such as but not limited too, UV barriers, static charge protection, water and liquid barriers, vapor barrier, grease and fat barriers, as well as many others.

In some embodiments the disposable container has been constructed from traditionally non-disposable materials. However, through the inclusion of degrading compound, for example a time released enzyme specific to the depolymerization of the container material, the container may be classified as disposable.

Illustrated in FIG. 1 is a cross section of two single walled disposable containers. 1a represents the contents of the disposable containers. 1b represents the wall or sides of the disposable containers. 1c represents a low emissivity coating that has been applied to the disposable container. 1d represents lines of thermal conduction from the contents of the container to the surrounding environment. 1e represents the emission of thermal radiation from the surface of the disposable container. As illustrated in FIG. 1, the disposable container that has been coated with a low emissivity coating on its outside wall is emitting little to no thermal radiation while the standard disposable container is a powerful radiator of thermal energy.

Illustrated in FIG. 2 is a cross section of two double walled disposable containers. 2a represents the contents of the disposable containers. 2b represents the first, and innermost wall of the disposable containers. 2c represents the second and outermost wall of the disposable containers. 2d represents the low emissivity coated surface of the inner second wall of the disposable container facing towards the first wall of the disposable container. 2e represents the lines of thermal conduction away from the containers contents and into the surrounding environment. 2f represents the emission of thermal radiation from surfaces of the disposable container. 2g represents the emission and reflection of thermal radiation from the surfaces of the disposable container. 2h represents the contained air gap between the inner and outer walls of the disposable container. As illustrated in FIG. 2, the disposable container containing a low emissivity coating on the inside of its outermost wall, meant to reflect thermal radiation back to the first wall of the container, will still radiate thermal energy from its outermost wall, similar to how the disposable container with no coating does. This embodiment therefore does not prevent thermal radiative losses from occurring in the disposable container.

Figure 3:
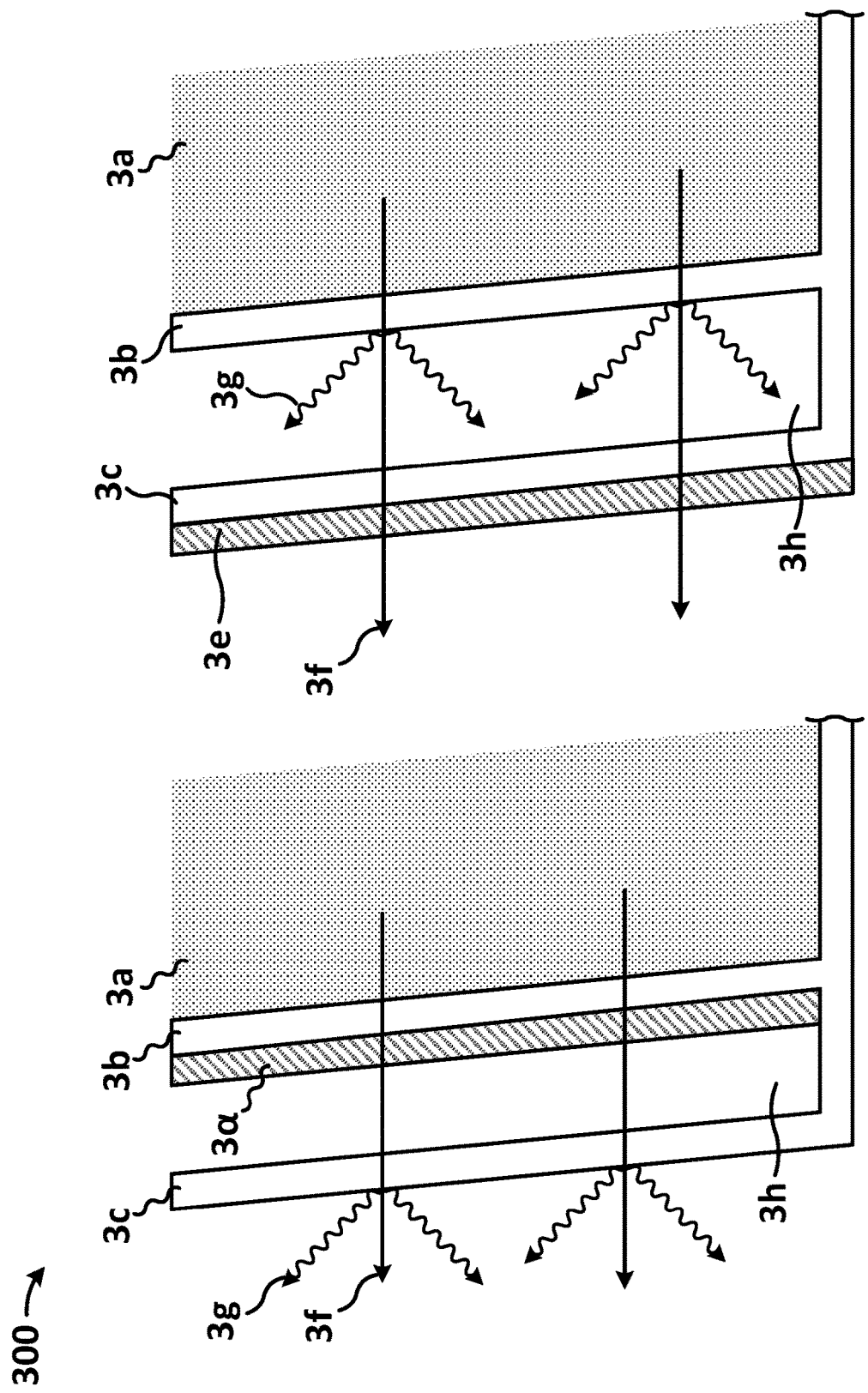
FIG. 3 is a cross section of two double walled disposable containers.

Illustrated in FIG. 3 is a cross section of two double walled disposable containers. 3a represents the contents of the disposable containers. 3b represents the innermost wall of the disposable containers. 3c represents the outermost wall of the disposable containers. 3d represents a low emissivity coating applied to the outside of the innermost wall of the disposable container, facing away from the containers contents. 3e represents a low emissivity coating applied to the outside of the outermost wall of the disposable container, facing away from the containers contents. 3f represents lines of thermal conduction away from the containers contents and into the surrounding environment. 3g represents lines of thermal radiation emission from the walls of the disposable container. 3h represents the contained air gap between the inner and outer walls of the disposable container. As illustrated in FIG. 3, each surface that contains the proper application of a low emissivity coating, facing away from the containers contents, effectively lessens or prevents the emission of thermal radiation from the surface it has been applied to.

Figure 4:
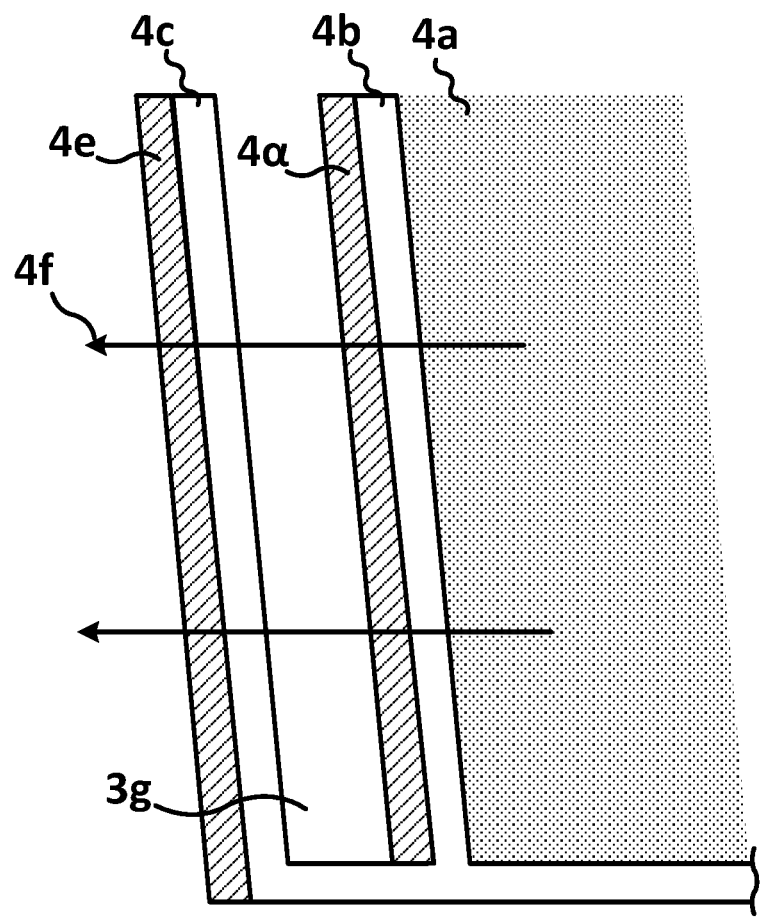
FIG. 4 is a cross section of a double walled disposable container.

Illustrated in FIG. 4 is a cross section of a double walled disposable container. 4a represents the contents of the disposable container. 4b represents the innermost wall of the disposable containers. 4c represents the outermost wall of the disposable container. 4d represents the proper implementation of a low emissivity coating applied to the innermost wall of the disposable container, and facing away from the containers contents. 4e represents the proper implementation of a low emissivity coating applied to the outermost wall of the disposable container, and facing away from the containers contents. 3f represents lines of thermal conduction away from the containers contents and into the surrounding environment. 3g represents the contained air gap between the inner and outer walls of the disposable container. As illustrated in FIG. 4, in this embodiment, the low emissivity coatings have been properly applied to all surfaces of the container facing away from the containers contents. This greatly reduces or prevents these surfaces ability to emit thermal radiation. As mentioned previously, "all surfaces facing away from the disposable containers contents, in contact with any form of matter that is translucent to thermal wavelengths should be of a low emissivity." FIG. 4 is a representation of this concept.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The world "or," in reference to a list of two or more items, covers all of the following interpretations of the word; any of the items in the list, all of the items in the list, and any combination of the items in the list.

The phrases "in some embodiments," "according to some embodiments," "in the embodiments shown," "in other embodiments," and the like generally mean the particular feature, structure, or characteristic following the phrase exists in at least one implementation of the present technology, and may exist in more than one implementation. In addition, such phrases do not necessarily refer to the same embodiments or different embodiments.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved added, subdivided, combined, and/or modified to provide alternative or sub-combinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to these implementations noted above, but also may include fewer elements.

These and other changes can be made to the technology in light of the above Detailed Description. While the above describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all the equivalent ways of practicing or implementing the technology under the claims.

To reduce the number of claims, certain aspects of the technology are presented below in certain claim forms, but the application contemplates the various aspects of the technology in any number of claim forms. For example, while only one aspect of the technology is recited as a computer-readable medium claim, other aspects may likewise be embodied as a computer-readable medium claim, or in other forms, such as being embodied in a means-plus-function claim. Any claims intended to be treated under 35 U.S.C. § 112(f) will begin with the words "means for," but use of the term "for" in any other context is not intended to invoke treatment under 35 U.S.C. § 112 (f). Accordingly, the application reserves the right to pursue additional claims after filing this application to pursue such additional claim forms, in either this application or in a continuing application.

I claim:

1. A method of manufacturing a double walled disposable container having an inner cavity, the method comprising:
   attaching an interior cylindrical sidewall to a base, wherein the interior cylindrical sidewall has an inner surface and an outer surface, the inner surface of the interior cylindrical sidewall facing the inner cavity, the outer surface of the interior cylindrical sidewall facing away from the inner cavity,
   wherein the interior cylindrical sidewall is attached to the base at a location inside an outer perimeter of the base;
   attaching an exterior cylindrical sidewall to the outer perimeter of the base, wherein the exterior cylindrical sidewall has an inner surface and an outer surface, the inner surface of the exterior cylindrical sidewall facing the outer surface of the interior cylindrical sidewall, and the outer surface of the exterior cylindrical sidewall facing away from the outer surface of the interior cylindrical sidewall,
   wherein the attaching step comprises forming an air gap defined and contained between the inner surface of the exterior cylindrical sidewall, the outer surface of the inner cylindrical sidewall, and the base; and
   applying, using a deposition process, a surface coating having an emissivity of ≤0.05 to at least a portion of one or both of: the outer surface of the interior cylindrical sidewall, and the outer surface of the exterior cylindrical sidewall,
   wherein the surface coating is a chemically deposited surface coating applied via a deposition process.

2. The method as in claim 1, wherein the surface coating is an aluminum surface coating.

3. The method as in claim 2, wherein the surface coating has an emissivity of 0.03.

4. The method as in claim 2, wherein the surface coating prevents static electricity buildup.

5. The method as in claim 2, wherein the surface coating is non-toxic.

6. The method as in claim 1, wherein the interior cylindrical sidewall, the exterior cylindrical sidewall and the base are composed of one or more of a biodegradable substrate, a compostable substrate, a recyclable substrate, a paper substrate, a recyclable polymer substrate, a biodegradable polymer substrate, a biodegradable substrate, or a polymer substrate laminated to the disposable container.

7. The method as in claim 1, wherein the interior cylindrical sidewall, the exterior cylindrical sidewall, and the base are composed of a material comprising a depolymerization compound that causes the interior cylindrical sidewall, the exterior cylindrical sidewall and the base to depolymerize.

8. The method as in claim 1, wherein the surface coating is applied to at least one or more of the interior cylindrical sidewall, the exterior cylindrical sidewall, and the base before the interior cylindrical sidewall and the exterior cylindrical sidewall are attached to the base.

9. The method as in claim 1, wherein the base has an inner surface facing the inner cavity and an outer surface facing away from the inner cavity, and wherein the applying step comprises applying the surface coating to at least a portion of the outer surface of the base.

10. The method as in claim 1, wherein the deposition process includes Chemical Vapor Deposition (CVD), Physical Vapor Deposition (PVD), Plasma Enhanced CVD (PECVD), Atomic Layer Deposition (ALD), Chemical Solution Deposition (CSD), Chemical Bath Deposition (CBD), Metalorganic Vapor Phase Epitaxy (MOCVD), Vacuum Deposition, Molecular Beam Epitaxy (MBE), Chemical Beam Epitaxy (CBE), Sputtering, Pulsed Laser Deposition, Ion Beam Deposition, Cathodic Arc Deposition (arc-PVD), Electrohydrodynamic Deposition (Electrospray Deposition), Frank-van-der-Merwe Growth Mode, Stranksi-Krastanov Growth Mode, Volmer-Weber Growth Mode, or Thin Film Printing.

\* \* \* \* \*